United States Patent
Takano (10) Patent No.: US 7,223,614 B2
(45) Date of Patent: May 29, 2007

(54) METHOD FOR MANUFACTURING SEMICONDUCTOR DEVICE, AND SEMICONDUCTOR DEVICE

(75) Inventor: Katsuo Takano, Nagano (JP)

(73) Assignee: Seiko Epson Corporation (JP)

( * ) Notice: Subject to any disclaimer, the term of this patent is extended or adjusted under 35 U.S.C. 154(b) by 82 days.

(21) Appl. No.: 11/155,031

(22) Filed: Jun. 16, 2005

(65) Prior Publication Data

US 2005/0280059 A1   Dec. 22, 2005

(30) Foreign Application Priority Data

Jun. 18, 2004   (JP) .............................. 2004-181353

(51) Int. Cl.
*H01L 21/00* (2006.01)
*H01L 21/20* (2006.01)

(52) U.S. Cl. .................... 438/3; 438/381; 257/E21.009

(58) Field of Classification Search .................... 438/3, 438/239, 381
See application file for complete search history.

(56) References Cited

FOREIGN PATENT DOCUMENTS

| JP | 2002-176149 | 6/2002 |
|---|---|---|
| JP | 2002-299576 | 10/2002 |
| JP | 2003-051582 | 2/2003 |

*Primary Examiner*—Scott B. Geyer
*Assistant Examiner*—Elias Ullah
(74) *Attorney, Agent, or Firm*—Harness, Dickey & Pierce, P.L.C.

(57) ABSTRACT

A first hydrogen barrier film and an intermediate layer are formed on an interlayer dielectric film. A ferroelectric capacitor is formed on the intermediate layer, and a second hydrogen barrier film is formed over the entire surface including on the upper surface and side surfaces of the ferroelectric capacitor and on the intermediate layer. Then, the second hydrogen barrier film and the intermediate layer are removed while leaving at least portions on the upper surface and side surfaces of the ferroelectric capacitor. Then, a third hydrogen barrier film is formed on the second hydrogen barrier film, on side surfaces of the second hydrogen barrier film and the intermediate layer, and on the first hydrogen barrier film.

14 Claims, 5 Drawing Sheets

METHOD FOR MANUFACTURING SEMICONDUCTOR DEVICE, AND SEMICONDUCTOR DEVICE

RELATED APPLICATIONS

This application claims priority to Japanese Patent Application No. 2004-181353 filed Jun. 18, 2004 which is hereby expressly incorporated by reference herein in its entirety.

BACKGROUND

1. Technical Field

The present invention relates to methods for manufacturing semiconductor devices having ferroelectric capacitors, and semiconductor devices. In particular, the present invention relates to a method for manufacturing a semiconductor device in which a ferroelectric capacitor is protected from hydrogen included in a lower layer thereof, such that electrical characteristics of the ferroelectric capacitor are difficult to deteriorate, and also relates to such a semiconductor device.

2. Related Art

Figure 5:
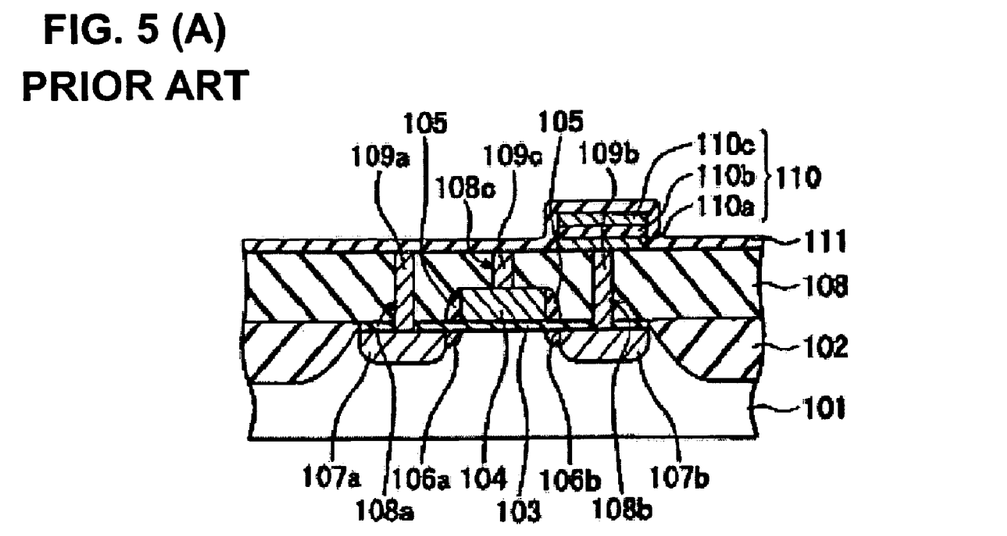

FIGS. 5(A) and (B) are cross-sectional views for describing a conventional method for manufacturing a semiconductor device having a ferroelectric capacitor. First, as shown in FIG. 5 (A), an element isolation film 102 is formed in a silicon substrate 101 by, for example, a LOCOS method. The element isolation film 102 is open above an element region. Next, by thermally oxidizing the silicon substrate 101, a gate oxide film 103 is formed in the element region. Next, a polysilicon film is formed over the entire surface including on the gate oxide film 103, and the polysilicon film is patterned. By this, a gate electrode 104 is formed on the gate oxide film 103. Next, by using the gate electrode 104 and the element isolation film 102 as a mask, impurity ions are injected in the silicon substrate 101. By this, low concentration impurity regions 106a and 106b are formed in the silicon substrate 101.

Next, a silicon oxide film is formed over the entire surface including on the gate oxide film 103, and the silicon oxide film is etched back. By this, side walls 105 are formed on side walls of the gate electrode 104. Then, by using the gate electrode 104, the sidewalls 105 and the element isolation film 102 as a mask, impurity ions are injected in the silicon substrate 101. By this, impurity regions 107a and 107b that become source and drain are formed in the silicon substrate 101. In this manner, a transistor is formed in the element region.

Next, an interlayer dielectric film 108 is formed over the entire surface including on the transistor by a CVD method. In here, a material gas including hydrogen atoms, such as, $SiH_4$, TEOS (Si $(OC_2H_5)_4$), or the like is used. Next, a photoresist film (not shown) is coated on the interlayer dielectric film 108, and then the photoresist film is exposed to light and developed. By this, a resist pattern is formed on the interlayer dielectric film 108. Then, by using the resist pattern as a mask, the interlayer dielectric film 108 is etched. By this, contact holes 108a and 108b respectively located above the impurity regions 107a and 107b, and a contact hole 108c located above the gate electrode 104 are formed.

Then, the resist pattern is removed. Next, a Ti film and a TiN film that become a barrier metal are successively deposited by a sputter method in the contact holes 108a, 108b and 108c and on the interlayer dielectric film 108, and a tungsten (W) film is further deposited thereon. Then, the tungsten film, the TiN film and the Ti film on the interlayer dielectric film 108 are removed by a CMP (Chemical Mechanical Polishing) method or etching back. By this, W plugs 109a, 109b and 109c are embedded in the contact holes 108a, 108b and 108c, respectively.

Next, a Pt film that becomes a lower electrode, a ferroelectric film and a Pt film that becomes an upper electrode are laminated in this order on the W plug 109b and the interlayer dielectric film 108. Next, a photoresist film (not shown) is formed on the Pt film that becomes an upper electrode, and the photoresist film is exposed to light and developed. By this, a resist pattern is formed on the Pt film that becomes an upper electrode. Next, by using the resist pattern as a mask, the Pt film, the ferroelectric film and the Pt film are etched. By this, a ferroelectric capacitor 110 having a lower electrode 110a, a ferroelectric film 110b and an upper electrode 110c laminated in this order on the W plug 109b is formed. Then, the resist pattern is removed.

Because the ferroelectric film 110b includes oxygen, it is reduced if hydrogen, water or hydroxyl (hereafter described as hydrogen and the like) enters the ferroelectric film 110b, and its electrical characteristics deteriorate. In order to prevent this incident, a hydrogen barrier film 111 is formed on the ferroelectric capacitor 110 and the interlayer dielectric film 108. The hydrogen barrier film 111 is formed from, for example, Al oxide or Al nitride.

Next, as shown in FIG. 5 (B), a second interlayer dielectric film 112 is formed on the hydrogen barrier film 111 by a CVD method. In here, a material gas including hydrogen atoms, such as, $SiH_4$, TEOS, or the like is used, but hydrogen does not reach the ferroelectric film 110b of the ferroelectric capacitor 110 because the ferroelectric capacitor 110 is covered by the hydrogen barrier film 111. For this reason, the ferroelectric film 110b does not deteriorate when the second interlayer dielectric film 112 is formed, and therefore the electrical characteristics of the ferroelectric capacitor 110 do not deteriorate.

Next, a photoresist film (not shown) is coated on the second interlayer dielectric film 112, and then the photoresist film is exposed to light and developed. By this, a resist pattern is formed on the second interlayer dielectric film 112. Then, by using the resist pattern as a mask, the second interlayer dielectric film 112 and the hydrogen barrier film 111 are etched. By this, via holes 112a and 112c located above the W plugs 109a and 109c, respectively, and a via hole 112b located above the ferroelectric capacitor 110 are formed in the second interlayer dielectric film 112 and the hydrogen barrier film 111.

Thereafter, the resist pattern is removed. Then, a Ti film and a TiN film that become a barrier metal are successively deposited by a sputter method in the via holes 112a–112c and on the second interlayer dielectric film 112, and a tungsten (W) film is further deposited thereon. Then, the tungsten film, the TiN film and the Ti film on the second interlayer dielectric film 112 are removed by a CMP method or etching back. By this, W plugs 113a, 113b and 113c are embedded in the via holes 112a, 112b and 112c, respectively.

Next, an Al alloy film is formed over the entire surface including on the second interlayer dielectric film 112 and on the W plugs 113a–113c, and the Al alloy film is patterned. By this, Al alloy wirings 114a, 114b and 114c respectively connected to the W plugs 113a, 113b and 113c are formed.

A technology similar to the above manufacturing method is described in Japanese Laid-open Patent Application 2002-176149 (FIG. 2).

In the method described above, the upper surface of the ferroelectric capacitor is covered by the hydrogen barrier film. For this reason, even when hydrogen or the like is generated in a step after the ferroelectric capacitor has been formed, the hydrogen is difficult to reach the ferroelectric film of the ferroelectric capacitor. However, when the interlayer dielectric film located below the ferroelectric capacitor is heated after the ferroelectric capacitor has been formed, gas such as hydrogen or the like may be caused from the interlayer dielectric film. In this case, there is a possibility that the degassed hydrogen or the like may reach the ferroelectric capacitor, and may deteriorate the ferroelectric capacitor. Also, there is a possibility that hydrogen generated in a step after the ferroelectric capacitor has been formed may reach the ferroelectric capacitor through the interlayer dielectric film from the side of the silicon substrate. For this reason, it is desired that the ferroelectric capacitor be protected from hydrogen contained in a lower layer thereof.

The present invention has been made in view of the circumstances described above, and its object is to provide a method for manufacturing a semiconductor device in which a ferroelectric capacitor is protected from hydrogen included in a lower layer thereof, such that electrical characteristics of the ferroelectric capacitor are difficult to deteriorate, and also relates to such a semiconductor device.

SUMMARY

To solve the problems described above, a method for manufacturing a semiconductor device, in accordance with the present invention, includes:

a step of forming a first hydrogen barrier film on a dielectric film;

a step of forming, on the first hydrogen barrier film, an intermediate layer composed of a film having a lower internal stress compared to the first hydrogen barrier film;

a step of forming a connection hole in the first hydrogen barrier film and the intermediate layer;

a step of embedding a conductor in the connection hole;

a step of forming a ferroelectric capacitor having a lower electrode, a ferroelectric film and an upper electrode laminated on the intermediate layer and the conductor;

a step of forming a second hydrogen barrier film on an entire surface including on an upper surface and side surfaces of the ferroelectric capacitor and on the intermediate layer;

a step of removing the second hydrogen barrier film and the intermediate layer, while leaving at least a portion located in the upper surface and the side surface of the ferroelectric capacitor; and a step of forming a third hydrogen barrier film on the second hydrogen barrier film, on side surfaces of the second hydrogen barrier film and the intermediate layer, and on the first hydrogen barrier film.

According to the method for manufacturing a semiconductor device, the ferroelectric capacitor is covered by the first hydrogen barrier film and the third hydrogen barrier film without any gap. Accordingly, even when hydrogen degasses from the dielectric film located below the ferroelectric capacitor, the hydrogen is difficult to enter the ferroelectric capacitor. Accordingly, the electrical characteristics of the ferroelectric capacitor are difficult to deteriorate.

It is noted that, when the first hydrogen barrier film has a large internal stress, there is a possibility that the internal stress may affect the electrical characteristics of the ferroelectric capacitor. For this reason, the first hydrogen barrier film may preferably be made thin. On the other hand, in order to connect the ferroelectric capacitor with a semiconductor element or a wiring located therebelow, it is necessary to form a connection hole in the first hydrogen barrier film and embed a conductor in the connection hole. In this embedding step, there is a possibility that the first hydrogen barrier film may be damaged, and its hydrogen barrier capability may be lowered.

In contrast, according to the method for manufacturing a semiconductor device described above, because the intermediate layer composed of a film having a lower internal stress compared to the first hydrogen barrier film is formed on the first hydrogen barrier film, the first hydrogen barrier film is protected by the intermediate layer. Accordingly, the hydrogen barrier capability of the first hydrogen barrier film is difficult to deteriorate.

Although hydrogen may be occluded in the intermediate layer, the intermediate layer is removed while leaving a portion thereof located below the ferroelectric capacitor and its marginal area before the third hydrogen barrier film is formed in accordance with the method for manufacturing a semiconductor device described above. For this reason, hydrogen becomes more difficult to enter the ferroelectric capacitor. It is noted that, in the removal step, hydrogen may be generated in the atmosphere. However, because the upper surface and side surfaces of the ferroelectric capacitor are covered by the second hydrogen barrier film before the removal step, the degree of deterioration of the ferroelectric capacitor becomes diminished.

The step of embedding the conductor in the connection hole may be a step of embedding the conductor in the connection hole by depositing a conductive film in the connection hole and on the intermediate layer, and removing the conductive film from the intermediate layer by CMP or etching back.

After the step of forming the third hydrogen barrier film, a step of forming a first interlayer dielectric film on the third hydrogen barrier film, a step of forming a second connection hole in the first interlayer dielectric film, the third hydrogen barrier film and the second hydrogen barrier film at a location above the ferroelectric capacitor, and a step of embedding a second conductor in the second connection hole may further be included.

A transistor may be formed under the dielectric film, and the transistor and the lower electrode of the ferroelectric capacitor may be connected through the conductor.

Another method for manufacturing a semiconductor device, in accordance with the present invention, includes:

a step of forming a first hydrogen barrier film on a dielectric film;

a step of forming an intermediate layer on the first hydrogen barrier film;

a step of forming a ferroelectric capacitor having a lower electrode, a ferroelectric film and an upper electrode laminated on the intermediate layer;

a step of forming a second hydrogen barrier film on an entire surface including on an upper surface and side surfaces of the ferroelectric capacitor and on the intermediate layer;

a step of removing the second hydrogen barrier film and the intermediate layer, while leaving at least a portion located in the upper surface and the side surface of the ferroelectric capacitor; and a step of forming a third hydrogen barrier film on the second hydrogen barrier film, on side surfaces of the second hydrogen barrier film and the intermediate layer, and on the first hydrogen barrier film.

According to the method for manufacturing a semiconductor device, the ferroelectric capacitor is covered by the first hydrogen barrier film and the third hydrogen barrier film without any gap. Accordingly, even when hydrogen degasses from the dielectric film located below the ferroelectric capacitor, the hydrogen is difficult to enter the ferroelectric capacitor. Accordingly, the electrical characteristics of the ferroelectric capacitor are difficult to deteriorate.

In each of the methods for manufacturing a semiconductor device described above, the present invention is particularly effective when the dielectric film is formed by a CVD method using a starting material including hydrogen as a starting material.

The first hydrogen barrier film may be, for example, a silicon nitride film, and the intermediate layer may be, for example, a silicon oxide film. In this case, the silicon nitride film may preferably have a film thickness of 50 nm or more but 300 nm or less.

The step of forming the second hydrogen barrier film may be a step of forming an aluminum oxide film by, for example, a sputtering method or a CVD method. Also, the step of forming the third hydrogen barrier film may be a step of forming an aluminum oxide film by, for example, a sputtering method or a CVD method.

Another method for manufacturing a semiconductor device, in accordance with the present invention, includes:

a step of forming a transistor having a gate electrode and impurity regions for a source and a drain, respectively;

a step of forming a dielectric film on the transistor;

a step of forming in the dielectric film a first connection hole located above the gate electrode, and second and third connection holes located above the impurity regions;

a step of embedding first to third conductors in the first to third connection holes, respectively;

a step of forming a first hydrogen barrier film on the dielectric film and the first to third conductors;

a step of forming on the first hydrogen barrier film an intermediate layer composed of a film having a lower internal stress compared to the first hydrogen barrier film;

a step of forming a fourth connection hole in the first hydrogen barrier film and the intermediate layer located above the second conductor;

a step of embedding a fourth conductor in the fourth connection hole;

a step of forming a ferroelectric capacitor having a lower electrode, a ferroelectric film and an upper electrode laminated on the intermediate layer at a position overlapping with the fourth conductor;

a step of forming a second hydrogen barrier film over an entire surface including on an upper surface and side surfaces of the ferroelectric capacitor, and on the intermediate layer;

a step of removing the second hydrogen barrier film and the intermediate layer, while leaving at least a portion located in the upper surface and the side surface of the ferroelectric capacitor; and a step of forming a third hydrogen barrier film on the second hydrogen barrier film, on side surfaces of the second hydrogen barrier film and the intermediate layer, and on the first hydrogen barrier film.

In the method for manufacturing a semiconductor device, after the step of forming the third hydrogen barrier film, a step of forming a first interlayer dielectric film on the third hydrogen barrier film, a step of forming a plurality of fifth connection holes in the first interlayer dielectric film, the third hydrogen barrier film and the first hydrogen barrier film located above the first to third conductors, respectively, and forming a sixth connection hole in the first interlayer dielectric film, the third hydrogen barrier film and the second hydrogen barrier film located above the ferroelectric capacitor; and a step of embedding fifth and sixth conductors in the fifth and sixth connection holes may be further included.

Another method for manufacturing a semiconductor device, in accordance with the present invention, includes:

a step of forming a transistor having a gate electrode and impurity regions for a source and a drain, respectively;

a step of forming a dielectric film on the transistor;

a step of forming a first hydrogen barrier film on the dielectric film;

a step of forming on the first hydrogen barrier film an intermediate layer composed of a film having a lower internal stress compared to the first hydrogen barrier film;

a step of forming a ferroelectric capacitor having a lower electrode, a ferroelectric film and an upper electrode laminated in this order on the intermediate layer with a part of the lower electrode being exposed;

a step of forming a second hydrogen barrier film over an entire surface including on an upper surface and side surfaces of the ferroelectric capacitor, and on the intermediate layer;

a step of removing the second hydrogen barrier film and the intermediate layer, while leaving at least a portion located on the upper surface and the side surface of the ferroelectric capacitor;

a step of forming a third hydrogen barrier film on the second hydrogen barrier film, on side surfaces of the second hydrogen barrier film and the intermediate layer, and on the first hydrogen barrier film;

a step of forming in the third hydrogen barrier film, the first hydrogen barrier film and the dielectric film a first connection hole located above the gate electrode, and second and third connection holes respectively located above the impurity regions, and in the third hydrogen barrier film and the second hydrogen barrier film a fourth connection hole located above the portion on the lower electrode and a fifth connection hole located above the upper electrode; and a step of forming on the third hydrogen barrier film a first wiring connected to the gate electrode through the first connection hole, a second wiring connected to one of the impurity regions through the second connection hole, a third wiring connected to the other of the impurity regions and the lower electrode through the third connection hole and the fourth connection hole, respectively, and a fourth wiring connected to the upper electrode through the fifth connection hole.

In any of the methods for manufacturing a semiconductor device described above, after the step of forming the third hydrogen barrier film, a step of heating the dielectric film and the intermediate layer may be further included. In the heating step, even when hydrogen or the like degasses from the interlayer dielectric film located below the ferroelectric capacitor, the hydrogen or the like is difficult to enter the ferroelectric capacitor. Accordingly, the electrical characteristics of the ferroelectric capacitor become difficult to deteriorate.

A semiconductor device in accordance with the present invention includes:

a dielectric film;

a first hydrogen barrier film formed on the dielectric film;

an intermediate layer formed on the first hydrogen barrier film, and composed of a film having a lower internal stress compared to the first hydrogen barrier film;

a lower electrode formed on the intermediate layer;

a ferroelectric layer formed on the lower electrode;

an upper electrode formed on the ferroelectric layer;

a second hydrogen barrier film that covers the upper electrode, the ferroelectric layer and the lower electrode, and has a marginal portion located above the intermediate layer; and a third hydrogen barrier film that covers the second hydrogen barrier film and the intermediate layer, and has a marginal portion located above the intermediate layer.

BRIEF DESCRIPTION OF THE DRAWINGS

FIG. 1(A) is a cross-sectional view for describing a method for manufacturing a semiconductor device in accordance with a first embodiment, (B) is a cross-sectional view for describing a step next to (A), and (C) is a cross-sectional view for describing a step next to (B).

FIG. 2(A) is a cross-sectional view for describing a step next to (C) in FIG. 1, (B) is a cross-sectional view for describing a step next to (A), (C) is a cross-sectional view for describing a step next to (B), (D) is a cross-sectional view for describing a step next to (C).

FIG. 3(A) is a cross-sectional view for describing a method for manufacturing a semiconductor device in accordance with a second embodiment, (B) is a cross-sectional view for describing a step next to (A), and (C) is a cross-sectional view for describing a step next to (B).

FIG. 4(A) is a cross-sectional view for describing a step next to (C) in FIG. 3, and (B) is a cross-sectional view for describing a step next to (A).

FIG. 5(A) is a cross-sectional view for describing a conventional method for manufacturing a semiconductor device, and (B) is a cross-sectional view for describing a step next to (A).

DETAILED DESCRIPTION

Figure 1:
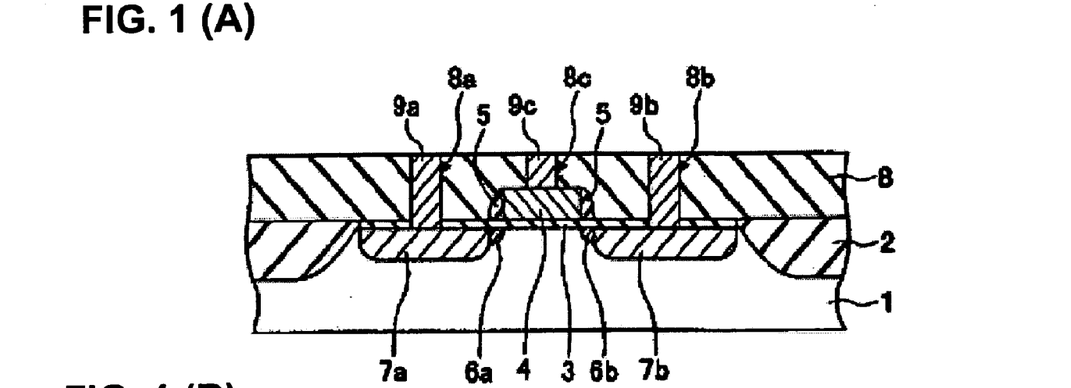
Figure 2:
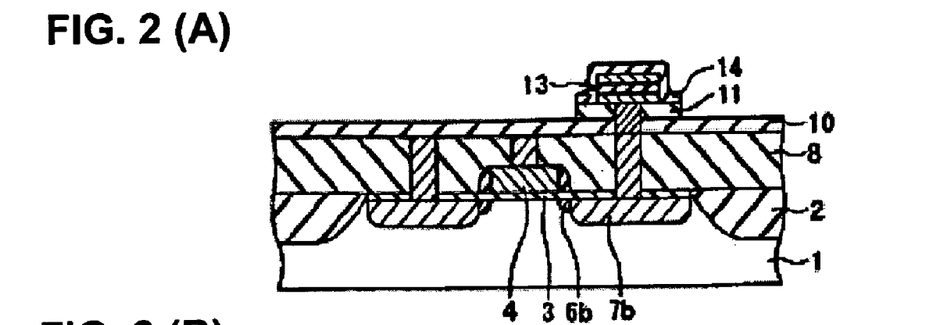

Embodiments of the present invention are described below with reference to the accompanying drawings. FIG. 1 and FIG. 2 are cross-sectional views for describing a method for manufacturing a semiconductor device in accordance with a first embodiment. The present embodiment pertains to a method for forming a stacked type ferroelectric memory.

First, as shown in FIG. 1 (A), an element isolation film 2 is formed in a silicon substrate 1 by, for example, a LOCOS method. The element isolation film 2 is open above an element region. Next, the silicon substrate 1 is thermally oxidized. By this, a gate oxide film 3 is formed on the silicon substrate 1 located at the element region. Next, a polysilicon film is formed over the entire surface including on the gate oxide film 3, and the polysilicon film is patterned. By this, a gate electrode 4 is formed on the gate oxide film 3. Next, by using the gate electrode 4 and the element isolation film 2 as a mask, impurity ions are injected in the silicon substrate 1. By this, low concentration impurity regions 6a and 6b are formed in the silicon substrate 1.

Next, a silicon oxide film is formed over the entire surface including on the gate oxide film 3, and the silicon oxide film is etched back. By this, side walls 5 are formed on side walls of the gate electrode 4. Then, by using the gate electrode 4, the sidewalls 5 and the element isolation film 2 as a mask, impurity ions are injected in the silicon substrate 1. By this, an impurity region 107a that becomes a source and an impurity region 107b that becomes a drain are formed in the silicon substrate 1. In this manner, a transistor is formed in the element region.

Next, an interlayer dielectric film 8 is formed over the entire surface including on the transistor by a CVD method. The interlayer dielectric film 8 includes silicon oxide as a main composition, and a material gas including hydrogen atoms, such as, $SiH_4$, TEOS or the like is used. For this reason, during the film formation, hydrogen, hydroxyl and water (hereafter described as hydrogen or the like) is generated, and the hydrogen or the like is occluded in the interlayer dielectric film 8. Next, a photoresist film (not shown) is coated on the interlayer dielectric film 8, and then the photoresist film is exposed to light and developed. By this, a resist pattern is formed on the interlayer dielectric film 8. Then, by using the resist pattern as a mask, the interlayer dielectric film 8 is etched. By this, contact holes 8a and 8b respectively located above the impurity regions 7a and 7b, and a contact hole 8c located above the gate electrode 4 are formed.

Then, the resist pattern is removed. Next, a Ti film and a TiN film that become a barrier metal are successively deposited in this order by a sputter method in the contact holes 8a, 8b and 8c and on the interlayer dielectric film 8, and a tungsten film is further deposited thereon. For depositing the tungsten film, for example, a CVD method using a material gas containing $WF_6$ is used. Then, the tungsten film, the TiN film and the Ti film on the interlayer dielectric film 8 are removed by a CMP method or etching back. By this, W plugs 9a, 9b and 9c are embedded in the contact holes 8a, 8b and 8c, respectively.

Next, as shown in FIG. 1 (B), a first hydrogen barrier film 10 is formed over the entire surface including on the interlayer dielectric film 8 and on the W plugs 9a–9c. The first hydrogen barrier film 10 may be, for example, a silicon nitride film, and may be formed by a CVD method. It is noted that a silicon nitride film as the first hydrogen barrier film 10 may preferably have a minimum thickness that can function as a hydrogen barrier film, and may preferably be, for example, 50 nm or more but 300 nm or less in thickness. By so doing, the influence that the internal stress of the silicon nitride film may give to the characteristics of a ferroelectric capacitor to be formed above the silicon nitride film can be made smaller.

It is noted that the first hydrogen barrier film 10 may be an aluminum oxide film, an aluminum nitride film or an aluminum oxinitride film. In this case, the first hydrogen barrier film 10 may be formed by, for example, a sputter method. By the first hydrogen barrier film 10, hydrogen or the like contained in the interlayer dielectric film 8 cannot move upward, and would not enter a ferroelectric capacitor to be formed in later steps.

Next, an intermediate layer 11 is formed on the first hydrogen barrier film 10. The intermediate layer 11 may use a material having a lower internal stress than that of the first hydrogen barrier film 10, and may be a silicon oxide film of, for example, 100 nm in thickness. The reason for forming the intermediate layer 11 is to prevent the first hydrogen barrier film 10 from becoming partially thinner in a CMP step or an etch-back step to be conducted later. When the intermediate layer 11 is a silicon oxide film, the intermediate layer 11 may be formed by a CVD method using a material gas containing hydrogen atoms, such as, $SiH_4$, TEOS or the like.

Then, a photoresist film (not shown) is coated on the intermediate layer 11, and the photoresist film is exposed to light and developed. By this, a resist pattern is formed on the intermediate layer 11. Next, by using the resist pattern as a mask, the intermediate layer 11 and the first hydrogen barrier film 10 are etched in this order. By this, a via hole 10a is formed in the intermediate layer 11 and the first hydrogen barrier film 10 located above the W plug 9b.

Then, the resist pattern is removed. Next, a Ti film and a TiN film that become a barrier metal are successively deposited in this order by, for example, a sputter method in the via hole 10a and on the intermediate layer 11, and a tungsten film is further deposited thereon. For depositing the tungsten film, for example, a CVD method using a material gas containing $WF_6$ is used. Then, the tungsten film, the TiN film and the Ti film located on the intermediate layer 11 are removed by a CMP method or etching back. By this, a W plug 12 is formed in the via hole 10a located above the W plug 9b. It is noted that, during the step where the tungsten film, the TiN film and the Ti film are subjected to CMP or etched back, a lower layer below the Ti film may be partially polished or etched. However, such a lower layer is not the first hydrogen barrier film 10 but the intermediate layer 11, such that the first hydrogen barrier film 10 does not become partially thinner, and its hydrogen barrier capacity is maintained.

Then, as shown in FIG. 1 (C), an Ir film, an $IrO_x$ film and a Pt film are laminated in this order on the W plug 12 and on the intermediate layer 11, whereby a lower conductive film having a thickness of 200 nm is formed. Then, a ferroelectric film having a thickness of 150 nm–200 nm is formed on the lower conductive film. The ferroelectric film may be a film containing Pb, Zr, Ti and O (for example, PZT film), or a film containing Sr, Bi and Ta (for example SBT film). Next, a Pt film, an $IrO_x$ film and a Ir film are laminated in this order on the ferroelectric film, whereby an upper conductive film having a thickness of 200 nm is formed.

Next, a photoresist film (not shown) is formed on the upper conductive film, and the photoresist film is exposed to light and developed. By this, a resist pattern is formed on the upper conductive film. Next, by using the resist pattern as a mask, the upper conductive film, the ferroelectric film and the lower conductive film are etched. By this, a ferroelectric capacitor 13 having a lower electrode 13a, a ferroelectric film 13b and an upper electrode 13c laminated in this order in a position overlapping the W plug 12 on the intermediate layer 11 is formed.

Then, the resist pattern is removed. Next, a second hydrogen barrier film 14 is formed on the upper surface and side surfaces of the ferroelectric capacitor 13, and on the intermediate layer 11. The second hydrogen barrier film 14 is a film that is formed by a process that does not generate hydrogen, and may be an aluminum oxide film. When the second hydrogen barrier film 14 is an aluminum oxide film, it is formed by a sputter method or a CVD method. By this, hydrogen becomes difficult to enter the ferroelectric capacitor 13.

Next, as shown in FIG. 2(A), a photoresist film (not shown) is coated on the second hydrogen barrier film 14, and then the photoresist film is exposed to light and developed. By this, a resist pattern is formed on the second hydrogen barrier film 14. Then, by using the resist pattern as a mask, the second hydrogen barrier film 14 and the intermediate layer 11 are etched. By this, the second hydrogen barrier film 14 and the intermediate layer 11 are removed while leaving portions thereof on the upper surface and side surfaces of the ferroelectric capacitor 13 and a portion of the intermediate layer 11 adjacent to the ferroelectric capacitor 13.

As described above, when the intermediate layer 11 is a silicon oxide film, the intermediate layer 11 may be formed by a CVD method using a material gas containing hydrogen atoms, such as, $SiH_4$, TEOS or the like. In this case, the intermediate layer 11 may contain therein hydrogen or the like. For this reason, portions among the intermediate layer 11 which can be removed may preferably be removed immediately after the second hydrogen barrier film 14 is formed on the upper surface of the ferroelectric capacitor 13, like in the present embodiment. It is noted that, in the step of removing the intermediate layer 11, hydrogen or the like may be contained in the atmosphere. However, because the upper surface and side surfaces of the ferroelectric capacitor 13 are covered by the second hydrogen barrier film 14, the degree of deterioration of the ferroelectric capacitor 13 which may be caused by hydrogen or the like in the atmosphere becomes diminished. Then, the resist pattern is removed.

Then, as shown in FIG. 2(B), a third hydrogen barrier film 15 is formed on the second hydrogen barrier film 14 and its side surfaces, side surfaces of the intermediate layer 11, and on the first hydrogen barrier film 10. The third hydrogen barrier film 15 is a film that is formed by a process that does not generate hydrogen, and may be an aluminum oxide film. When the third hydrogen barrier film 15 is an aluminum oxide film, it is formed by a sputter method or a CVD method.

In this state, the ferroelectric capacitor 13 is surrounded by the first hydrogen barrier film 10 and the third hydrogen barrier film 15 without a gap.

Next, as shown in FIG. 2(C), a second interlayer dielectric film 16 is formed on the third hydrogen barrier film 15. The second interlayer dielectric film 16 is formed from silicon oxide as a main composition, and a material gas containing hydrogen atoms, such as, $SiH_4$, TEOS or the like is used. For this reason, during the film formation, hydrogen or the like is generated. However, because the ferroelectric capacitor 13 is surrounded by the first hydrogen barrier film 10 and the third hydrogen barrier film 15, hydrogen or the like can not enter the ferroelectric capacitor 13 when the second interlayer dielectric film 16 is formed.

Next, a photoresist film (not shown) is coated on the second interlayer dielectric film 16, and then the photoresist film is exposed to light and developed. By this, a photoresist film is formed on the second interlayer dielectric film 16. Then, by using the photoresist film as a mask, the second interlayer dielectric film 16, the third hydrogen barrier film 15 and the first hydrogen barrier film 10 are etched in this order. By this, a via hole 16b is formed in the second interlayer dielectric film 16 and the third hydrogen barrier film 15 located above the upper electrode 13c of the ferroelectric capacitor 13. Also, via holes 16a and 16c are formed in the second interlayer dielectric film 16, the third hydrogen barrier film 15 and the first hydrogen barrier film 10 located above the W plugs 9a and 9c embedded in the interlayer dielectric film 8, respectively.

Then, as shown in FIG. 2(D), a Ti film and a TiN film that become a barrier metal are successively deposited in this order by, for example, a sputter method in the via holes 16a, 16b and 16c and on the second interlayer dielectric film 16, and a tungsten film is further deposited thereon. For depositing the tungsten film, for example, a CVD method using a material gas containing $WF_6$ is used. Then, the tungsten film, the TiN film and the Ti film are removed by CMP or etching back from areas on the second interlayer dielectric film 16. By this, a W plug 17b that is connected to the upper electrode 13c of the ferroelectric capacitor 13 is embedded in the via hole 16b, and W plugs 17a and 17c that are connected to the W plugs 9a and 9c are embedded in the via holes 16a and 16c, respectively.

Next, an Al alloy film is formed on the second interlayer dielectric film 16 and on the W plugs 17a, 17b and 17c. Next, a photoresist film is coated on the Al alloy film, and the photoresist film is exposed to light and developed. By this a resist pattern is formed on the Al alloy film. Then, by using the resist pattern as a mask, the Al alloy film is patterned. By this, the Al alloy film is patterned, whereby Al alloy wirings 18a, 18b and 18c extending above the W plugs 17a, 17b and 17c, respectively, are formed. The Al ally wiring 18a connects to the impurity region 7a that becomes a source of a transistor through the W plugs 17a and 9a. The Al ally wiring 18c connects to the gate electrode 4 of the transistor through the W plugs 17c and 9c. The Al ally wiring 18b connects to the upper electrode 13c of the ferroelectric capacitor 13 through the W plug 17b. It is noted that the lower electrode 13a of the ferroelectric capacitor 13 connects to the impurity region 7b that becomes a drain of the transistor through the W plugs 12 and 9b.

Then, the resist pattern is removed. In a process to be conducted hereafter (for example, deposition of silicon oxide by a CVD method, and tungsten film formation), the semiconductor device is heated. In this instance, hydrogen or the like may be degassed from each of the interlayer dielectric film 8 and the second interlayer dielectric film 16. However, the ferroelectric capacitor 13 is surrounded by the first and third hydrogen barrier films 10 and 15 without a gap. Accordingly, the degassed hydrogen or the like does not enter the ferroelectric capacitor 13. Moreover, even when hydrogen is generated in a process to be later conducted (for example, deposition of silicon oxide by a CVD method, and tungsten film formation), the hydrogen does not enter the ferroelectric capacitor 13 from the lower side of the ferroelectric capacitor 13.

In this manner, in accordance with the present invention, the first hydrogen barrier film 10 is formed on the interlayer dielectric film 8, the ferroelectric capacitor 13 is formed above the first hydrogen barrier film 10, and the third hydrogen barrier film 15 is formed on the upper surface and side surfaces of the ferroelectric capacitor 13 and on the first hydrogen barrier film 10. For this reason, the ferroelectric capacitor 13 is surrounded by the first and third hydrogen barrier films 10 and 15 without a gap. Accordingly, even when hydrogen or the like degasses from the interlayer dielectric films 8 and 16 in a later step, the degassed hydrogen or the like dos not enter the ferroelectric capacitor 13. Also, even when the second interlayer dielectric film 16 is formed above the ferroelectric capacitor 13 by using a CVD method that uses a material gas containing hydrogen such as $SiH_4$, TEOS or the like, hydrogen or the like generated during the film formation does not enter the ferroelectric capacitor 13.

Accordingly, the electrical characteristics of the ferroelectric capacitor 13 become more difficult to deteriorate.

Furthermore, the first hydrogen barrier film 10 is made to have a minimum thickness that can function as a hydrogen barrier film in order to minimize its internal stress, but the intermediate layer 11 that is a film having a smaller internal stress than that of the first hydrogen barrier film 10 is formed on the first hydrogen barrier film 10. For this reason, even when CMP or etch-back is conducted in the step of embedding W plugs in these films, the first hydrogen barrier film 10 is protected by the intermediate layer 11, and does not become thinner. Accordingly, the hydrogen barrier capability of the first hydrogen barrier film 10 is not damaged.

It is noted that there may be a case where hydrogen or the like may be occluded in the intermediate layer 11. However, the intermediate layer 11 is removed by etching, excluding portions located below the ferroelectric capacitor 13 and the circumferential area thereof, before the third hydrogen barrier film 15 is formed. For this reason, the degree of deterioration of the ferroelectric capacitor 13 by hydrogen or the like contained in the intermediate layer 11 is minimized.

Also, there is a possibility that the atmosphere contains hydrogen or the like in the step of removing the intermediate layer 11. However, the upper surface and side surfaces of the ferroelectric capacitor 13 are covered by the second hydrogen barrier film 14 before the intermediate layer 11 is removed. Accordingly, the degree of deterioration of the ferroelectric capacitor 13 by hydrogen or the like contained in the atmosphere is minimized.

Figure 3:
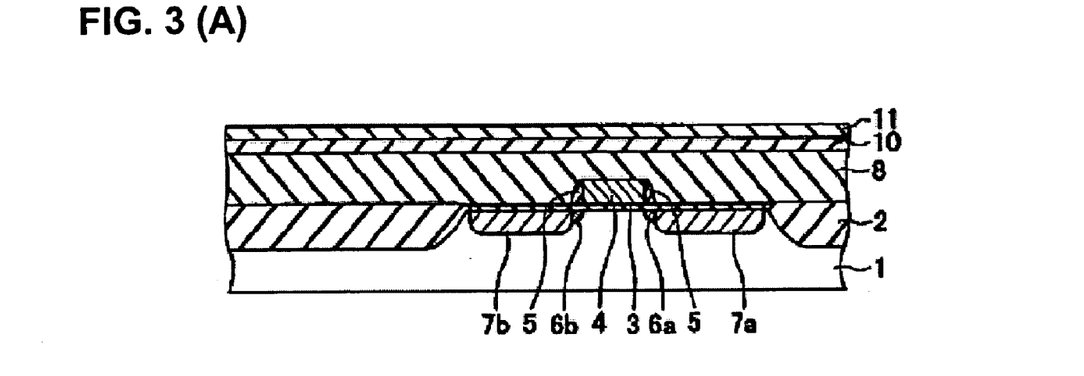
Figure 4:
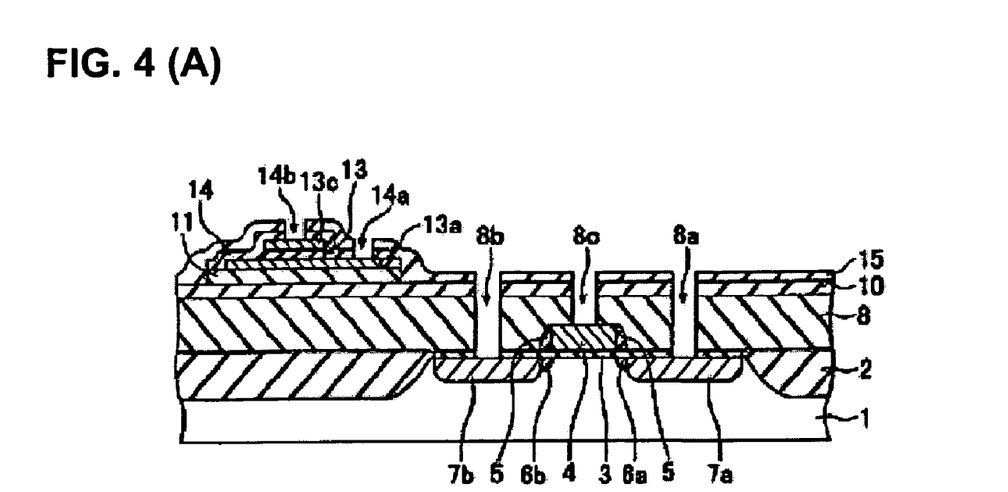

FIG. 3 and FIG. 4 are cross-sectional views for describing a method for manufacturing a semiconductor device in accordance with a second embodiment of the present invention. The present embodiment pertains to a method for forming a planar type ferroelectric memory. Composing elements that are identical with those of the first embodiment are appended with the same reference numbers, and their description is omitted.

First, as shown in FIG. 3(A), an element isolation film 2, a gate oxide film 3, a gate electrode 4, side walls 5, lower concentration impurity regions 6a and 6b, impurity regions 7a and 7b, and an interlayer dielectric film 8 are formed on a silicon substrate 1. A method of forming those elements is the same as the first embodiment. Next, a first hydrogen barrier film 10 and an intermediate layer 11 are laminated in this order on the interlayer dielectric film 8. The forming method of these is also the same as the first embodiment.

Next, as shown in FIG. 3(B), a lower conductive film having an Ir film, an $IrO_x$ film and a Pt film laminated in this order is formed on the intermediate layer 11. Then, a resist pattern is formed on the lower conductive film, and the lower conductive film is etched by using the resist pattern as a mask. By this, the lower conductive film is patterned, and a lower electrode 13a is formed on the intermediate layer 11.

Then, the resist pattern is removed. Next, a ferroelectric film is formed over the entire surface including on the lower electrode 13a, and an upper conductive film having a Pt film, an $IrO_x$ film and an Ir film laminated in this order is further formed thereon. Next, a resist pattern is formed on the upper conductive film, and by using the resist pattern as a mask, the upper conductive film and the ferroelectric film are etched in this order. By this, the upper conductive film and the ferroelectric film are patterned, whereby a ferroelectric film 13b and an upper electrode 13c are formed on the lower electrode 13a, excluding a part thereof.

In this manner, a ferroelectric capacitor 13 in which the lower electrode 13a, the ferroelectric layer 13b and the upper electrode 13c are laminated in this order is formed on the intermediate layer 11.

Next, a second hydrogen barrier film 14 is formed over the entire surface including on the ferroelectric capacitor 13 and the intermediate layer 11. The method of forming them is the same as the first embodiment.

Next, as shown in FIG. 3(C), the second hydrogen barrier film 14 and the intermediate layer 11 are removed while leaving portions on the upper surface and side surfaces of the ferroelectric capacitor 13 and a portion of the intermediate layer 11 adjacent to the ferroelectric capacitor 13. The removal method is the same as the first embodiment.

Next, a third hydrogen barrier film 15 is formed. This forming method is also the same as the first embodiment. In this state, the ferroelectric capacitor 13 is surrounded by the first hydrogen barrier film 10 and the third hydrogen barrier film 15 without a gap.

Next, as shown in FIG. 4(A), a photoresist film (not shown) is coated on the third hydrogen barrier film 15, and the photoresist film is exposed to light and developed. By this, a resist pattern is formed on the third hydrogen barrier film 15.

Next, by using the resist pattern as a mask, etching is conducted.

More specifically, the third hydrogen barrier film 15 and the second hydrogen barrier film 14 are etched above a portion that is not covered by the ferroelectric layer 13b among the lower electrode 13a, and above the upper electrode 13c. By this, via holes 14a and 14b are formed above the lower electrode 13a and the upper electrode 13c, respectively.

Also, the third hydrogen barrier film 15, the first hydrogen barrier film 10 and the interlayer dielectric film 8 are etched above the impurity regions 7a and 7b and the gate electrode 4 of the transistor. By this, contact holes 8a, 8b and 8c are formed above the impurity regions 7a and 7b and the gate electrode 4, respectively.

Next, as shown in FIG. 4(B), an Al alloy film is deposited on the third hydrogen barrier film 15, and in the contact holes 8a–8c and the via holes 14a and 14b. Then, a photoresist film is coated on the Al alloy film, and the photoresist film is exposed to light and developed. By this, a resist pattern is formed on the Al alloy film. Then, by using the resist pattern as a mask, the Al alloy film is patterned. By this, the Al alloy film is patterned, whereby Al alloy wirings 19a, 19b, 19c and 19d are formed.

The Al alloy wiring 19a has a part thereof embedded in the contact hole 8a, thereby connecting to the impurity region 7a that becomes a source.

The Al alloy wiring 19c has a part thereof embedded in the contact hole 8c, thereby connecting to the gate electrode 4. The Al alloy wiring 19d has a part thereof embedded in the via hole 14b, thereby connecting to the upper electrode 13c of the ferroelectric capacitor 13.

Also, the Al alloy wiring 19b has a part thereof embedded in the contact hole 8b, and another part thereof embedded in the via hole 14a. For this reason, the Al alloy wiring 19b connects the impurity region 7b that becomes a drain of the transistor and the lower electrode 13a of the ferroelectric capacitor 13.

In this manner, in accordance with the present embodiment, the ferroelectric capacitor 13 is also surrounded by the first and third hydrogen barrier films 10 and 15 without a gap. Accordingly, even when the interlayer dielectric film 8 is heated in a later step and hydrogen or the like is degassed, the hydrogen or the like does not enter the ferroelectric capacitor 13. Therefore the electrical characteristics of the ferroelectric capacitor 13 are difficult to deteriorate.

Furthermore, even when a second interlayer dielectric film is formed over the third hydrogen barrier film 15 and the Al alloy wirings 19a–19d by using a CVD method that uses a material gas containing hydrogen such as $SiH_4$, TEOS or the like, hydrogen or the like generated during the film formation does not enter the ferroelectric capacitor 13.

It is noted that the present invention is not limited to the embodiments described above, and many changes can be made and implemented within the range that does not deviate from the subject matter of the present invention.

What is claimed is:

1. A method for manufacturing a semiconductor device, comprising:
   forming a first hydrogen barrier film on a dielectric film;
   forming an intermediate layer composed of a film having a lower internal stress compared to the first hydrogen barrier film on the first hydrogen barrier film;
   forming a connection hole in the first hydrogen barrier film and the intermediate layer;
   embedding a conductor in the connection hole;
   a step of forming a ferroelectric capacitor having a lower electrode, a ferroelectric film and an upper electrode laminated on the intermediate layer and the conductor;
   forming a second hydrogen barrier film on an entire surface including on an upper surface and side surfaces of the ferroelectric capacitor and on the intermediate layer;
   removing the second hydrogen barrier film and the intermediate layer, while leaving at least a portion located in the upper surface and the side surface of the ferroelectric capacitor; and
   forming a third hydrogen barrier film on the second hydrogen barrier film, on side surfaces of the second hydrogen barrier film and the intermediate layer, and on the first hydrogen barrier film.

2. A method for manufacturing a semiconductor device according to claim 1, wherein embedding the conductor in the connection hole further comprises embedding the conductor in the connection hole by depositing a conductive film in the connection hole and on the intermediate layer, and removing the conductive film from the intermediate layer by CMP or etching back.

3. A method for manufacturing a semiconductor device according to claim 1, further comprising, after forming the third hydrogen barrier film:
   forming a first interlayer dielectric film on the third hydrogen barrier film;
   forming a second connection hole in the first interlayer dielectric film, the third hydrogen barrier film and the second hydrogen barrier film at a location above the ferroelectric capacitor; and
   embedding a second conductor in the second connection hole.

4. A method for manufacturing a semiconductor device according to claim 1, wherein a transistor is formed under the dielectric film, and the transistor and the lower electrode of the ferroelectric capacitor are connected through the conductor.

5. A method for manufacturing a semiconductor device according to claim 1, wherein the dielectric film is formed by a CVD method using a starting material including hydrogen as a starting material.

6. A method for manufacturing a semiconductor device according to claim 1, wherein the first hydrogen barrier film is a silicon nitride film, and the intermediate layer is a silicon oxide film.

7. A method for manufacturing a semiconductor device according to claim 6, wherein the silicon nitride film has a film thickness of 50 nm or more but 300 nm or less.

8. A method for manufacturing a semiconductor device according to claim 1, wherein forming the second hydrogen barrier film further comprises forming an aluminum oxide film by a sputtering method or a CVD method.

9. A method for manufacturing a semiconductor device according to claim 1, wherein forming the third hydrogen barrier film further comprises forming an aluminum oxide film by a sputtering method or a CVD method.

10. A method for manufacturing a semiconductor device according to claim 1, further comprising, after forming the third hydrogen barrier film, a step of heating the dielectric film and the intermediate layer.

11. A method for manufacturing a semiconductor device, comprising:

forming a first hydrogen barrier film on a dielectric film;

forming an intermediate layer on the first hydrogen barrier film;

forming a ferroelectric capacitor having a lower electrode, a ferroelectric film and an upper electrode laminated on the intermediate layer;

forming a second hydrogen barrier film on an entire surface including on an upper surface and side surfaces of the ferroelectric capacitor and on the intermediate layer;

removing the second hydrogen barrier film and the intermediate layer, while leaving at least a portion located in the upper surface and the side surface of the ferroelectric capacitor; and forming a third hydrogen barrier film on the second hydrogen barrier film, on side surfaces of the second hydrogen barrier film and the intermediate layer, and on the first hydrogen barrier film.

12. A method for manufacturing a semiconductor device, comprising:

forming a transistor having a gate electrode and impurity regions for a source and a drain, respectively;

forming a dielectric film on the transistor;

forming in the dielectric film a first connection hole located above the gate electrode, and second and third connection holes located above the impurity regions;

embedding first to third conductors in the first to third connection holes, respectively;

forming a first hydrogen barrier film on the dielectric film and the first to third conductors;

forming on the first hydrogen barrier film an intermediate layer composed of a film having a lower internal stress compared to the first hydrogen barrier film;

forming a fourth connection hole in the first hydrogen barrier film and the intermediate layer located above the second conductor;

embedding a fourth conductor in the fourth connection hole;

forming a ferroelectric capacitor having a lower electrode, a ferroelectric film and an upper electrode laminated on the intermediate layer at a position overlapping with the fourth conductor;

forming a second hydrogen barrier film over an entire surface including on an upper surface and side surfaces of the ferroelectric capacitor, and on the intermediate layer;

removing the second hydrogen barrier film and the intermediate layer, while leaving at least a portion located in the upper surface and the side surface of the ferroelectric capacitor; and forming a third hydrogen barrier film on the second hydrogen barrier film, on side surfaces of the second hydrogen barrier film and the intermediate layer, and on the first hydrogen barrier film.

13. A method for manufacturing a semiconductor device according to claim 12, further comprising, after forming the third hydrogen barrier film:

forming a first interlayer dielectric film on the third hydrogen barrier film;

forming a plurality of fifth connection holes in the first interlayer dielectric film, the third hydrogen barrier film and the first hydrogen barrier film located above the first to third conductors, respectively, and forming a sixth connection hole in the first interlayer dielectric film, the third hydrogen barrier film and the second hydrogen barrier film located above the ferroelectric capacitor; and embedding fifth and sixth conductors in the fifth and sixth connection holes.

14. A method for manufacturing a semiconductor device, comprising:

forming a transistor having a gate electrode and impurity regions for a source and a drain, respectively;

forming a dielectric film on the transistor;

forming a first hydrogen barrier film on the dielectric film;

forming on the first hydrogen barrier film an intermediate layer composed of a film having a lower internal stress compared to the first hydrogen barrier film;

forming a ferroelectric capacitor having a lower electrode, a ferroelectric film and an upper electrode laminated in this order on the intermediate layer with a part of the lower electrode being exposed;

forming a second hydrogen barrier film over an entire surface including on an upper surface and side surfaces of the ferroelectric capacitor, and on the intermediate layer;

removing the second hydrogen barrier film and the intermediate layer, while leaving at least a portion located on the upper surface and the side surface of the ferroelectric capacitor;

forming a third hydrogen barrier film on the second hydrogen barrier film, on side surfaces of the second hydrogen barrier film and the intermediate layer, and on the first hydrogen barrier film;

forming in the third hydrogen barrier film, the first hydrogen barrier film and the dielectric film a first connection hole located above the gate electrode, and second and third connection holes respectively located above the impurity regions, and in the third hydrogen barrier film and the second hydrogen barrier film a fourth connection hole located above the portion on the lower electrode and a fifth connection hole located above the upper electrode; and forming on the third hydrogen barrier film a first wiring connected to the gate electrode through the first connection hole, a second wiring connected to one of the impurity regions through the second connection hole, a third wiring connected to the other of the impurity regions and the lower electrode through the third connection hole and the fourth connection hole, respectively, and a fourth wiring connected to the upper electrode through the fifth connection hole.

* * * * *